US006878564B2

(12) United States Patent
Silverbrook

(10) Patent No.: US 6,878,564 B2
(45) Date of Patent: Apr. 12, 2005

(54) METHOD OF MANUFACTURING A LIGHT EMITTING SEMICONDUCTOR PACKAGE

(75) Inventor: Kia Silverbrook, Balmain (AU)

(73) Assignee: Silverbrook Research Pty Ltd, Balmain (AU)

( * ) Notice: Subject to any disclaimer, the term of this patent is extended or adjusted under 35 U.S.C. 154(b) by 0 days.

(21) Appl. No.: 10/853,175

(22) Filed: May 26, 2004

(65) Prior Publication Data

US 2004/0219700 A1 Nov. 4, 2004

Related U.S. Application Data

(63) Continuation of application No. 10/040,473, filed on Jan. 9, 2002, now Pat. No. 6,759,723.

(30) Foreign Application Priority Data

Jan. 10, 2001  (AU) .............................................. PR2456

(51) Int. Cl.[7] ......................... H01L 21/00; H01L 21/44; H01L 21/48; H01L 21/50
(52) U.S. Cl. ............................. 438/27; 438/7; 438/65; 438/116; 257/432; 257/433; 257/434; 257/680
(58) Field of Search ............................... 438/7, 27, 65, 438/116; 257/432, 433, 434, 680

(56) References Cited

U.S. PATENT DOCUMENTS

| 4,742,432 | A | 5/1988 | Thillays et al. |
|---|---|---|---|
| 4,889,587 | A | 12/1989 | Komuro |
| 5,230,759 | A | 7/1993 | Hiraiwa |
| 5,500,540 | A | 3/1996 | Jewell et al. |
| 5,656,776 | A | 8/1997 | Otani |
| 5,798,557 | A | 8/1998 | Salatino et al. |
| 5,805,757 | A | 9/1998 | Bloom |
| 5,824,177 | A | 10/1998 | Yoshihara et al. |
| 5,915,168 | A | 6/1999 | Salatino et al. |
| 5,923,995 | A | 7/1999 | Kao et al. |
| 5,953,355 | A | * 9/1999 | Kiely et al. .................... 372/43 |
| 6,001,664 | A | 12/1999 | Swirhun et al. |
| 6,365,920 | B1 | 4/2002 | Abramov et al. |
| 2002/0117623 | A1 | * 8/2002 | Cole ........................ 250/338.1 |

FOREIGN PATENT DOCUMENTS

| JP | 11-017043 | 1/1999 |
|---|---|---|
| JP | 0313459 | 1/2000 |
| WO | WO 00/46031 | 8/2000 |
| WO | WO 01/56920 | 8/2001 |
| WO | WO 01/56921 | 8/2001 |

* cited by examiner

*Primary Examiner*—Craig A. Thompson
*Assistant Examiner*—Nema Berezny

(57) ABSTRACT

A method of manufacturing a light emitting semiconductor package, the method comprising the steps of: obtaining a semiconductor wafer 252 which includes a plurality of light emitting devices 254 residing on or in a surface of the semiconductor wafer 252; forming at least one first hollow cap 256, each first hollow cap 256 formed to provide: a central portion 260 and first perimeter walls extending from the perimeter edge of the central portion with the free edges of the first perimeter walls adapted to be bonded to the surface of the semiconductor wafer 252 to provide a first cavity; at least one region 258 of the central portion 260 which is substantially transparent or translucent to electromagnetic radiation; bonding the at least one first hollow cap 256 to the semiconductor wafer 252, the central portion overlying at least one of the plurality of light emitting devices 254; and, separating the semiconductor wafer 252 with bonded caps 256 into light emitting semiconductor packages 250.

11 Claims, 13 Drawing Sheets

O₂ Plasma Etch

METHOD OF MANUFACTURING A LIGHT EMITTING SEMICONDUCTOR PACKAGE

This is a Continuation of Ser. No. 10/040,473 filed Jan. 9, 2002 now U.S. Pat. No. 6,759,723.

TECHNICAL FIELD

This invention relates to the molding and application of protective caps to microelectronic semiconductor chips on a wafer scale as opposed to application on an individual chip basis. More particularly the invention relates to the molding and application of protective caps to semiconductor chips incorporating light emitting devices.

BACKGROUND ART

Semiconductor chips are normally packaged in a protective layer or layers to protect the chip and its wire bonds from atmospheric and mechanical damage. Existing packaging systems typically use epoxy molding and thermal curing to create a solid protective layer around the chip. This is normally carried out on individually diced chips bonded to lead frames and so must be done many times for each wafer. Alternative methods of packaging include hermetically sealed metal or ceramic packages, and array packages such as ball grid array (BGA) and pin grid array (PGA) packages. Recently wafer scale packaging (WSP) has started to be used. This is carried out at the wafer stage before the chips are separated. The use of molding and curing techniques subjects the wafer to both mechanical and thermal stresses. In addition the protective cap so formed is a solid piece of material and so cannot be used for MEMS devices, since the MEMS device would be rendered inoperable by the polymer material. Existing packaging systems for MEMS devices include thematically sealed packages for individual devices, or use silicon or glass wafer scale packaging, both of which are relatively high cost operation.

Devices which incorporate optically active devices, such as light emitting devices or photoreceptors, also require a cap with at least a portion of the cap transparent to the relative light. The caps also frequently require a lens to focus light passing through the cap and so the epoxy molding techniques cannot be used. The devices are typically packaged individually or use silicon or glass wafer scale packaging.

DISCLOSURE OF THE INVENTION

In one broad form the invention provides a light emitting semiconductor package including:

a) a chip having a top surface and a bottom surface and having at least one light emitting semiconductor device which emits electromagnetic radiation at one or more wavelengths from the top surface;

b) a first hollow molded cap having a central portion and a first perimeter wall extending from the perimeter of the central portion with the free edge of the first perimeter wall bonded to the top surface to provide a first cavity and which, in plan view, overlays part or all of at least one light emitting device, said central portion including at least one region which is at least substantially transparent or translucent to electromagnetic radiation at said one or more wavelengths; and wherein the first cap has been bonded to the semiconductor chip at the wafer stage prior to separation of the wafer into individual packages.

The at least one region may also refract the electromagnetic radiation emitted by said one at least one device.

The cap may also include at least one attachment means for attaching an electromagnetic radiation transmitting cable or fiber to the cap, whereby electromagnetic radiation emitted from the at least one device passes through the at least one region into the cable. The at least one attachment means is preferably a second perimeter wall extending from the periphery of the central portion away from the first perimeter wall or at least one recess in the central portion.

The package may also include a second cap bonded to the bottom surface of the chip.

The second cap may, in plan view, overlay part or all of the one or more devices.

BEST MODE OF CARRYING OUT THE INVENTION

Figure 1:
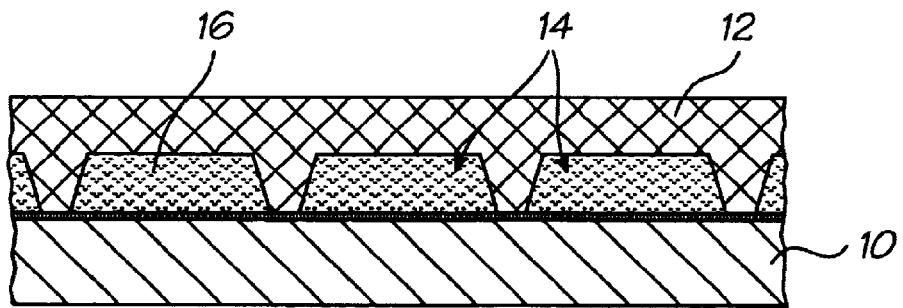
FIG. 1 shows a prior art method of forming protective caps on semiconductor chips.
Figure 2:
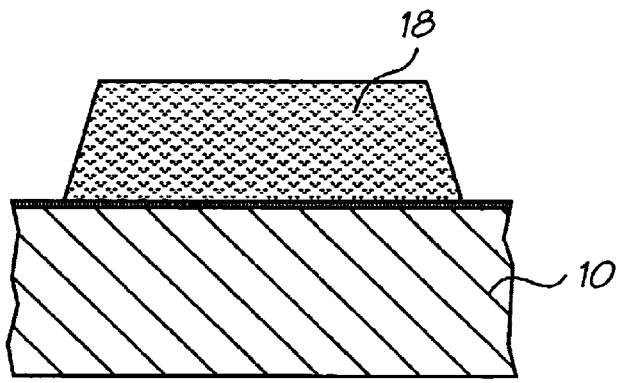
FIG. 2 shows a cross section of a prior art packaging made according to the FIG. 1 method.

Referring to FIGS. 1 and 2 there is show a prior art method of forming protective caps on semiconductor wafers on a wafer scale. A semiconductor wafer 10 is clamped against a mold 12 having cavities 14 formed therein and a liquid polymer material 16 is injected into the cavities 14. The polymer material sets to form solid protective caps 18. The wafer is then singulated using a wafer saw. This technique is not applicable to wafers having MEMS devices formed thereon as the liquid polymer material will surround the MEMS devices and stop them from working.

Figure 3:
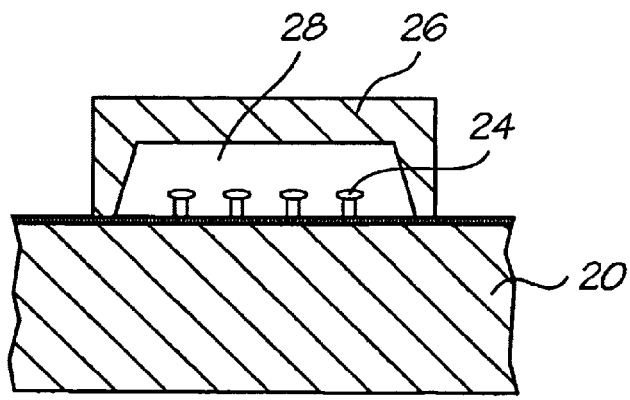
FIG. 3 shows a cross section of a prior art packaging of a MEMS device.

FIG. 3 shows the present prior art technique for protecting MEMS devices. The MEMS chip 20 including the MEMS devices 24, shown symbolically, is bonded to a silicon wafer 26. This may be carried out at the individual chip stage or at the wafer stage. The wafer 26 is typically etched using a crystallographic anisotropic etch using an etchant such as KOH to form a series of recesses 28 which correspond to the locations of the MEMS devices. The wafers 26 are carefully aligned with the MEMS wafer 20 and bonded thereto. While this can be an effective means of packaging MEMS devices, it is expensive as it requires an extra silicon (or sometimes glass) wafer, which must be etched to form the cavities.

Figure 4:
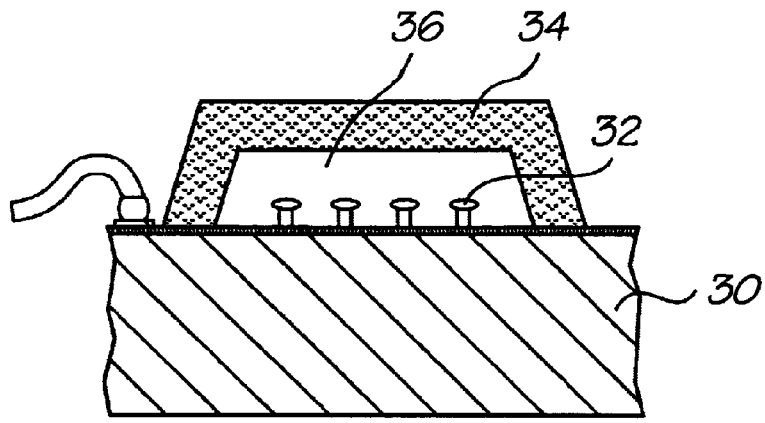
FIG. 4 shows a cross section through a MEMS device packaged according to the invention.

FIG. 4 shows a MEMS wafer 30 having surface MEMS 32 formed thereon. A hollow protective cap 34 of thermoplastic material made and bonded to the wafer 30 according to the invention is provided so as to form a mechanical and atmospheric protective barrier for the MEMS devices. The cap 34 forms a cavity 36 with the wafer to allow the MEMS device(s) to operate.

The use of molded thermoplastic hollow caps offers the possibility of providing inexpensive packaging. However, conventional techniques do not provide the required accuracy and thermal stability required for micro fabricated devices.

Figure 5:
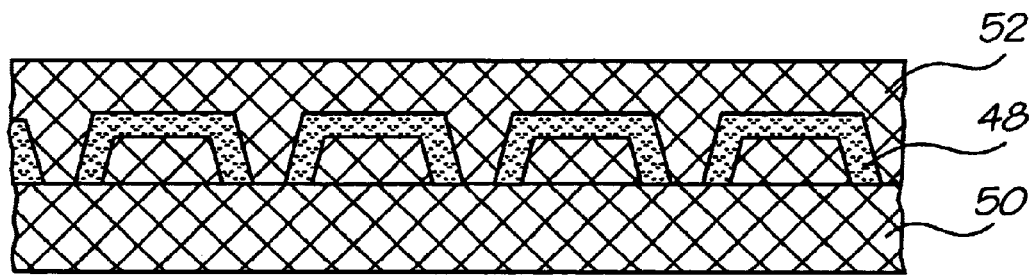
FIG. 5 shows a possible device for forming molded caps.
Figure 6:
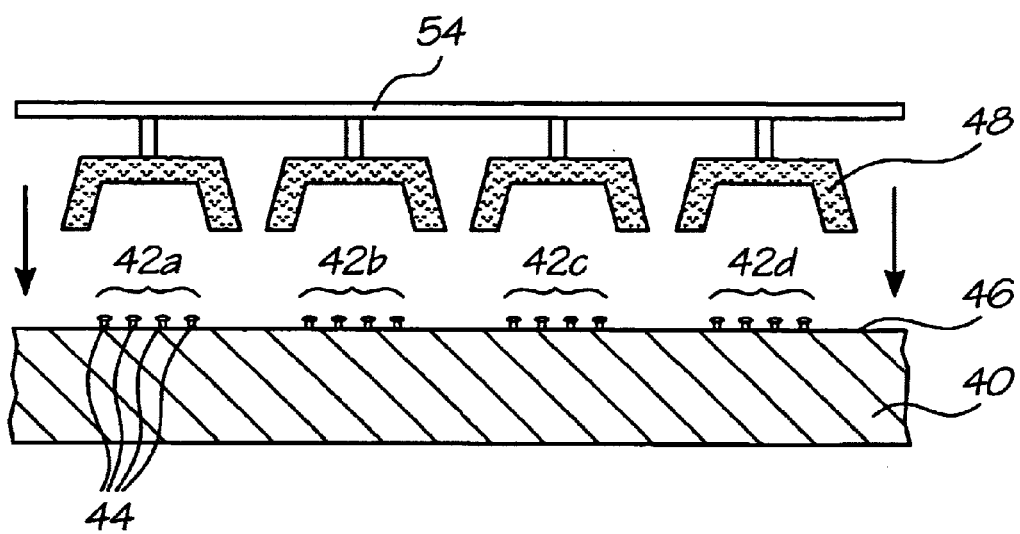
FIG. 6 shows method of applying caps formed using the device of FIG. 5a to a silicon wafer.
Figure 7:
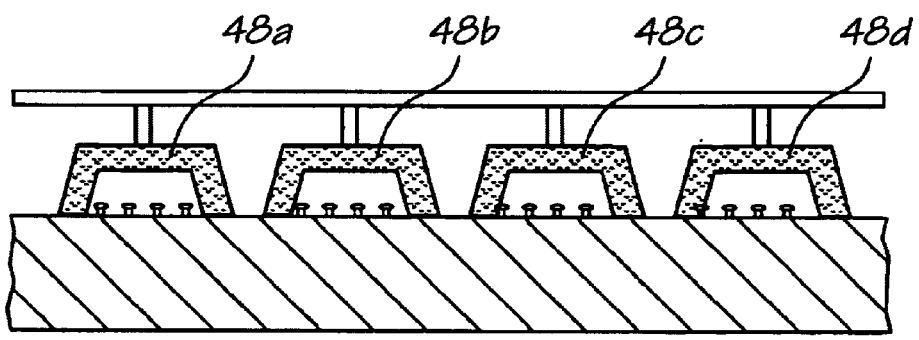
FIG. 7 shows the wafer and caps of FIG. 6 bonded together

FIGS. 5 to 7 show a possible technique for packaging a semiconductor wafer 40 having a number of groups 42 of micro fabricated devices 44, shown symbolically, formed on or in an upper surface 46.

Figure 20:
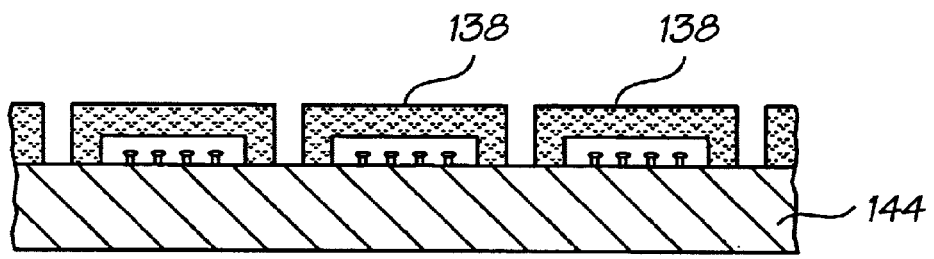
FIG. 20 shows a cross sectional side view of a wafer after application of the caps.
Figure 21:
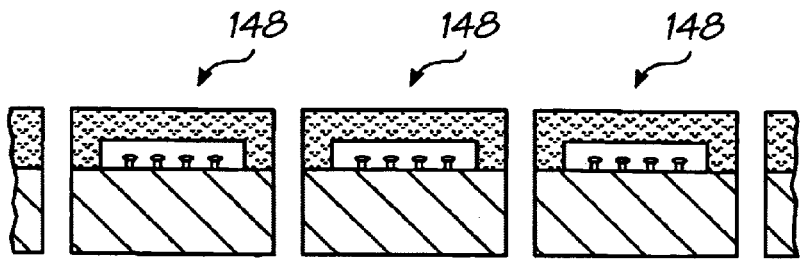
FIG. 21 shows a cross sectional side view of a series of chips after singulation of the wafer.

An array of caps 48 is formed using conventional injection molding methods and steel mold tools 50 & 52. The caps are supported on a sprule 54 at the same nominal spacing as the groups 42. Using this method will almost invariably lead to misalignment with resulting destruction of MEMS devices, as shown in FIG. 20. In FIG. 20 the cap 48a has been aligned correctly with its group of MEMS devices 42a. However the spacing between the caps is greater than the spacing of the groups so that cap 48b is not aligned correctly, but does not destroy any of the MEMS devices of its respective group 42b. However, the caps 44c & d are sufficiently misaligned that the perimeter walls of the caps overlay one or more of the MEMS devices 44, destroying their functionality.

This misalignment can be the result of a number of actors, including differential thermal expansion of the sprule material compared to the silicon wafer, non rigidity of the molded components and the lack of machinery designed for accurate alignment and bonding of polymers to wafers using these techniques.

Figure 8:
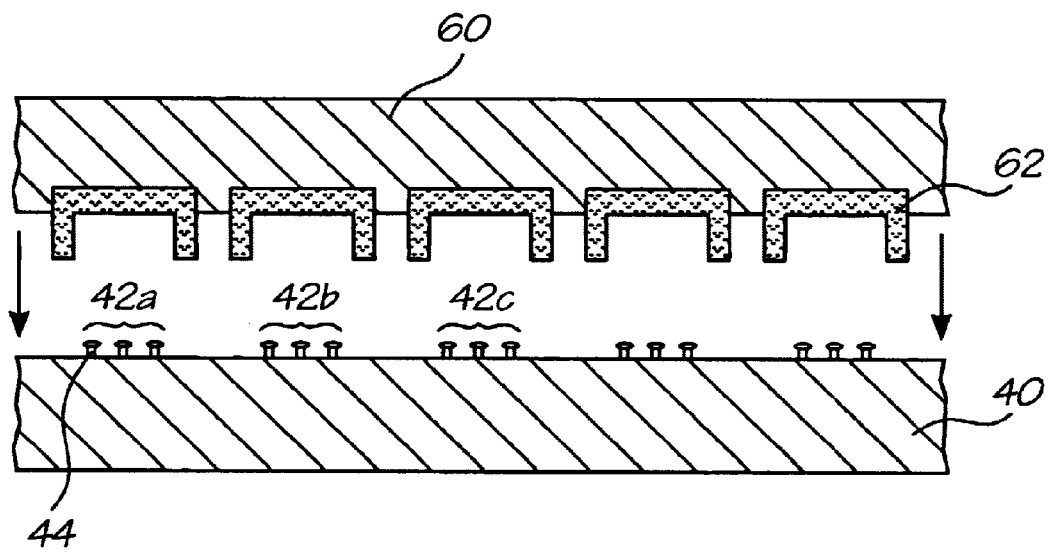
FIG. 8 symbolically shows a method for applying molded caps to a silicon wafer according to the invention.
Figure 9:
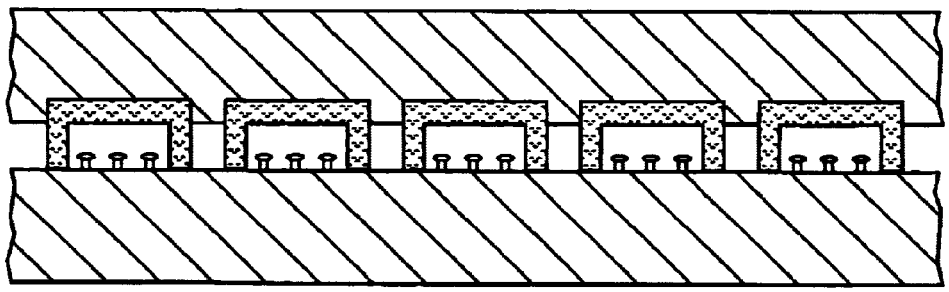
FIG. 9 shows the wafer and caps of FIG. 8 bonded together.

A solution is to use tools which have the same coefficient of thermal expansion as the wafer, such as silicon and FIGS. 8 & 9 symbolically show a technique using a silicon tool 60 to hold an array of thermoplastics caps 60 as the caps are bonded to the silicon wafer 40. Since the tool 60 is formed of the same material as the wafer 40, changes in temperature will not result in changes in alignment; the spacing of the caps 60 will change by the same amount as the spacing of the groups 42 of MEMS devices 44. Thus, when bonded, all of the caps will be correctly aligned, as shown in FIG. 9. Additionally there is much experience in working silicon to the required accuracy.

FIGS. 10 to 16 schematically show a first system for creating and applying hollow protective caps to wafers, preferably semiconductor wafers.

Figure 10:
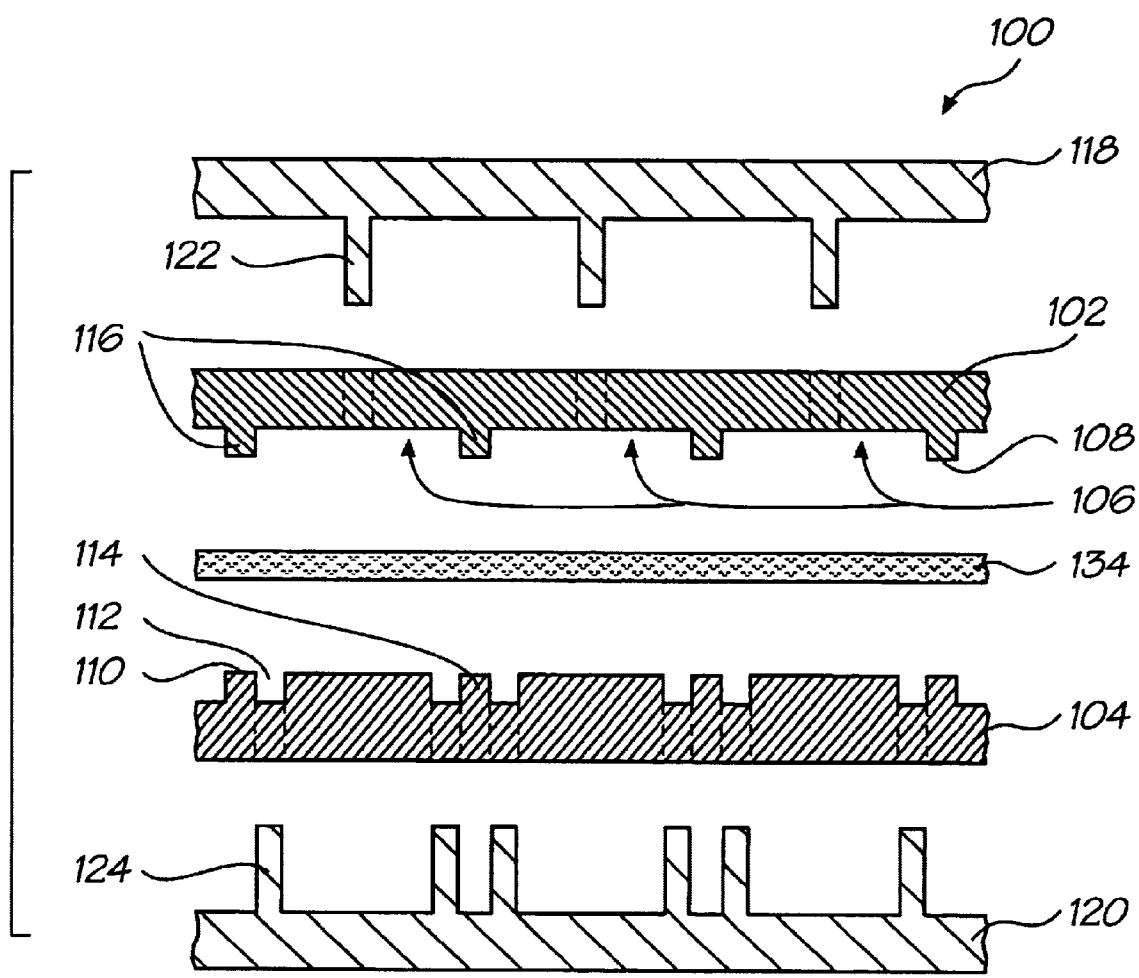
FIG. 10 shows an exploded cross sectional view of a device for forming the protective caps.
Figure 11:
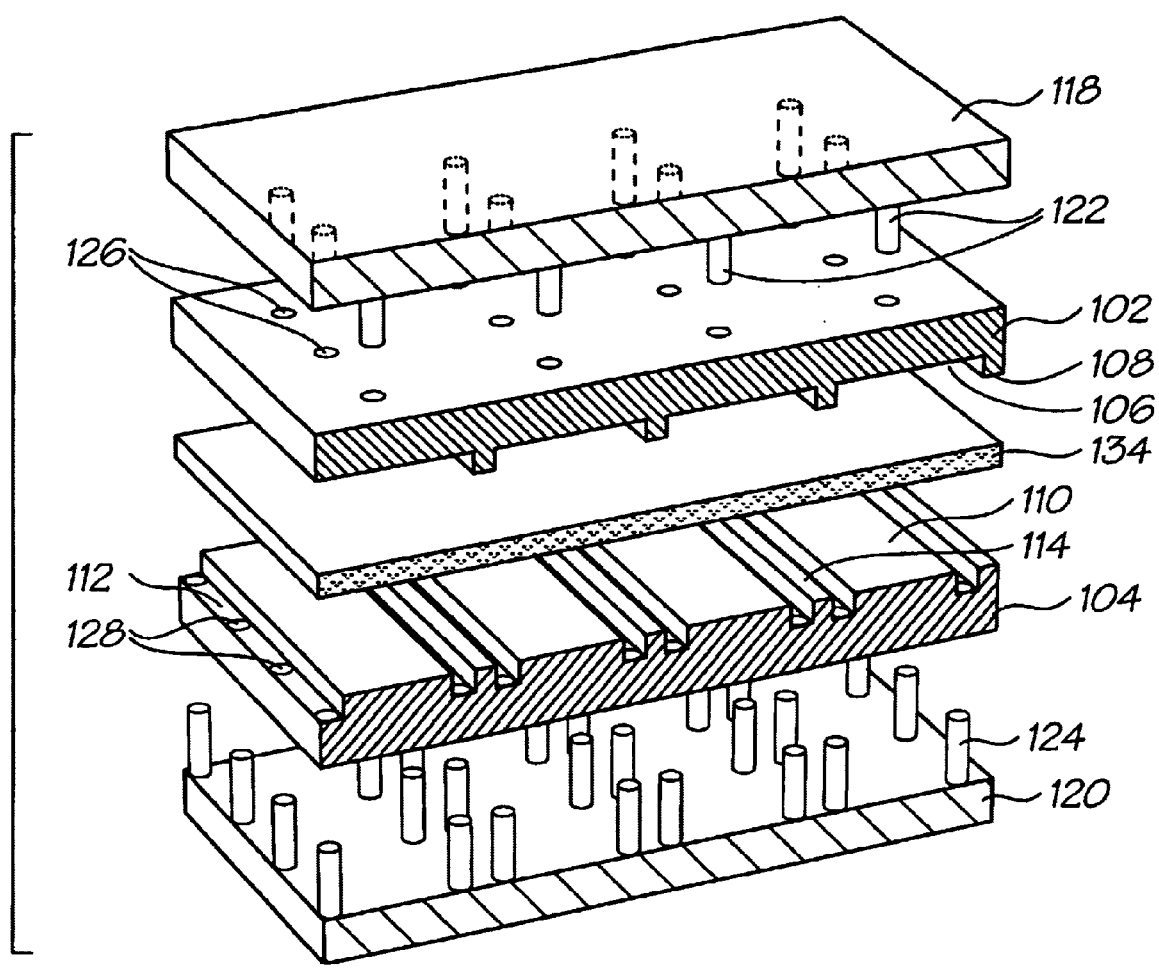
FIG. 11 shows an exploded perspective view of the device of FIG. 10.

FIG. 10 shows a molding system 100 for forming the hollow protective caps shown in FIG. 4 which may be used with MEMS devices or any other micro fabricated device. The molding system 100 includes two silicon wafers 102 & 104. The upper wafer 102 has been processed using conventional lithography and deep silicon etching techniques to have a series of recesses 106 in its lower surface 108. The lower wafer 104 has been similarly processed so that its upper surface 110 has a series of grooves 112 which align with edges of the recesses 106. The recesses 106 and grooves 112 are sized for the chip size of the wafer to be processed and repeat at centers corresponding to the repeat spacing on the wafer. In the embodiment shown the protective caps are designed for a MEMS inkjet printhead and so are very long relative to their width in plan view. The recesses are rectangular, although the ends of the recesses are not shown. The ends of the grooves 112 are not shown but it is to be understood that the grooves 112 at each side of each recess are in fact one groove which has a rectangular shape in plan view.

The grooves 112 for adjacent caps define a portion 114 of material which has not been etched. Similarly adjacent recesses 106 define a portion 116 of material which has not been etched. These portions of material 114 & 116 align with each other and when the two wafers are pressed together, the two wafers contact each other at these portions 114 & 116.

The two surfaces have been etched so that the groove 112 for the perimeter of the cap is all in the lower wafer 104 and the recess 104 for the central portion is all in the upper wafer 102.

It is not essential that the mold wafers only contact on surfaces which have not been etched. Nor is it essential that the central portion is defined by a recess in only one mold or that the perimeter walls be defined by a groove or recess in only one mold. The effective split line between the molds may be located at any position desired and need not be planar. However, planarity of the split line will typically simplify fabrication of the molds.

The assembly 100 also includes an upper release or eject wafer 118 and a lower release or eject wafer 120. These upper and lower release wafers are silicon wafers which have been processed utilizing conventional lithography and deep silicon etching techniques to have a series of release pins 122 and 124 respectively. The upper and lower mold wafers 102 & 104 are formed with corresponding holes 126 & 128 respectively which receive the pins 122 & 124. The upper holes 126 are located generally toward the center or axis of each recess 106 whilst the lower holes 128 are located in the grooves 112. However the location of the holes 126 and 128 is not especially critical and they may be placed as required for ejection of the molded caps.

The release pins 122 & 124 have a length greater than the depth of the corresponding holes. When the free ends of the pins 122 align with the inner ends of the holes 126, there is a gap 130 between the upper mold wafer 102 and the upper release wafer 118. In this embodiment the length of the lower pins 124 is the same as the thickness of the lower mold wafer 104. However the length of the pins 124 may be greater than the thickness of the wafer or it may be less. When the length of the pins 124 is less than the maximum thickness of the lower wafer 104 it needs to be greater than the depth of the holes 128, i.e. at least the reduced thickness of the wafer 104 at the grooves 112. The lower wafers 104 and 120 are positioned with the pins 124 part way inserted in the holes 128 but not extending beyond the holes 128 into the grooves 112 and with a gap 132 between the two wafers. The pins 124 preferably extend to be flush with the ends of the holes so as to form a substantially planar base to the groove 112.

The thickness of the mold and release wafers is about 800 microns whilst the gaps 130 and 132 are of the order of 10 to 100 microns in thickness. However this is not critical.

The mold tools are preferably etched using cryogenic deep silicon etching rather than Bosch etching as to produce a smoother etch. Bosch etching produces scalloping of etched side walls, such as the side walls of the pin and cap recesses. The scalloping makes the release of the molds from the molded material more difficult. In comparison, using a cryogenic etch results in much smother etched walls, with easier mold release.

A sheet 134 of thermoplastic material of about 200 to 500 microns in thickness is placed between the two wafers 102 & 104 and the assembly is placed in a conventional wafer bonding machine, such as an EV 501, available from Electronic Visions Group of Sharding, Austria.

The assembly is mechanically pressed together in the machine but it will be appreciated that the mold wafers may be urged toward each other to deform the thermoplastic sheet by applying an above ambient pressure to the gaps 130 & 132. Alternatively other means may be used.

Figure 12:
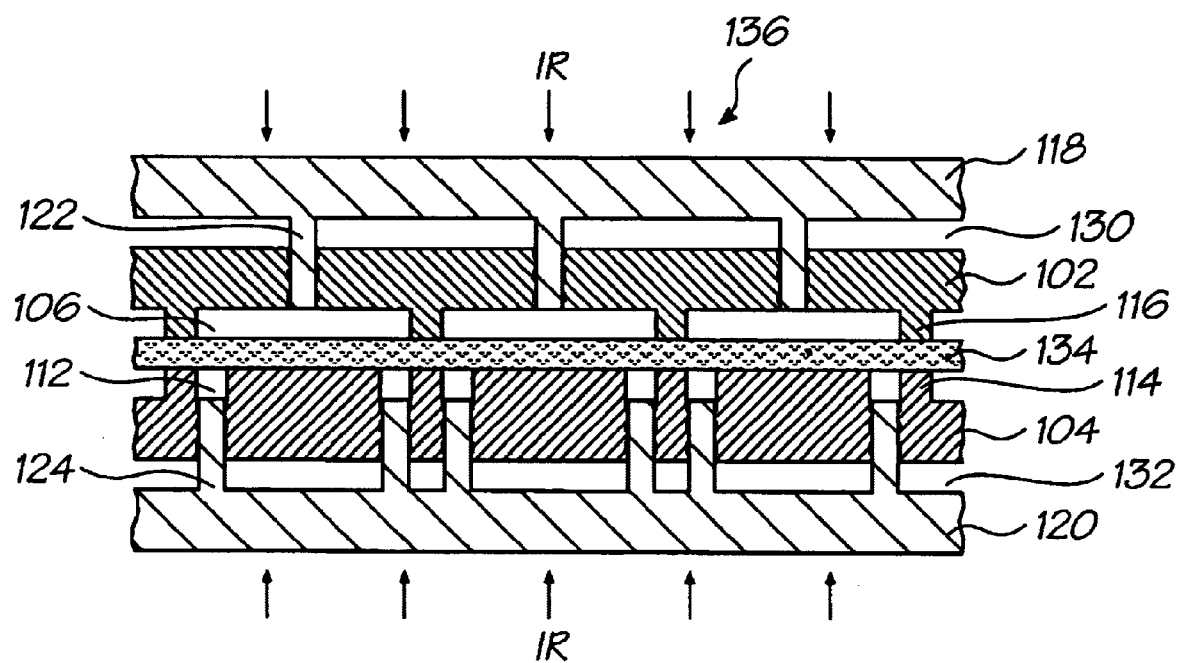
FIG. 12 shows a cross sectional view of the device of FIG. 10 at the commencement of molding.

The sheet 134 may be heated by conduction but is preferably heated by radiation and preferably by using infrared radiation, as indicated by arrows 136 in FIG. 12. A combination of conductive and radiant heating may be used. The mold and release wafers 102 & 104 and 118 & 120 respectively are formed of silicon, which is substantially transparent to infrared light of a wavelength in the range of about 1000 nm to about 5000 nm. The material 134 chosen either intrinsically absorbs light within this wavelength range or is doped so as to absorb light within this wavelength range. If the material 134 does not intrinsically absorb within this range, a suitable dopant is "carbon black" (amorphous carbon particles) which absorbs light at these wavelengths. Other suitable dopants may be used.

The sheet 134 is placed between the two mold wafers and exposed to infrared light at a suitable wavelength, as indicated by arrows 136. The infrared radiation is preferably supplied from both sides of the wafers and the sheet 134 to provide symmetrical heating, but this is not essential and the infrared radiation may be supplied from only one side. Because the silicon wafers are transparent to the infrared radiation, the infrared radiation passes through the wafers and is absorbed by the sheet 134. After heating to a suitable temperature the mold wafers may then be urged together to deform the sheet 134. The wafers may be pressed together whilst the sheet 134 is being heated rather than waiting for the sheet 134 to be fully heated, particularly if conductive heating is being used. If a material other then silicon is used heating of the sheet 134 may be achieved using electromagnetic radiation at other wavelengths to which the material used is substantially transparent.

Figure 13A:
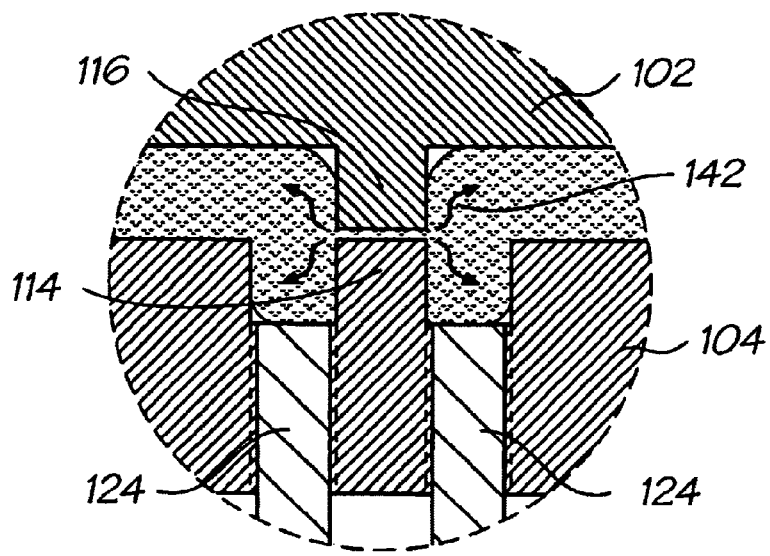
FIG. 13a shows an expanded view of part of FIG. 13.
Figure 13:
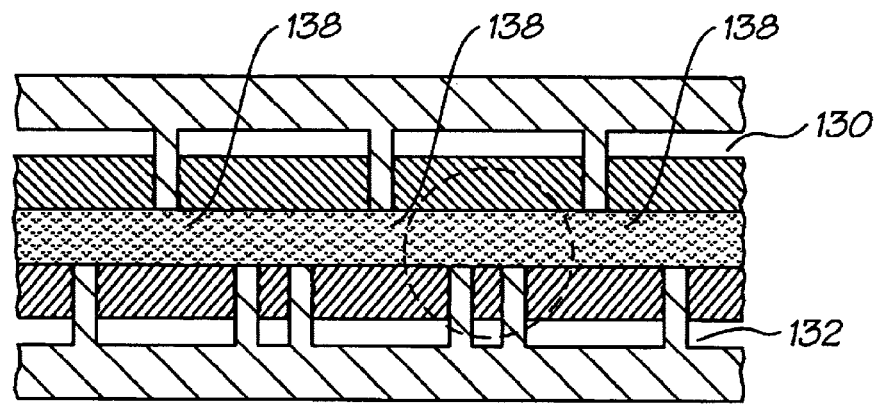
FIG. 13 shows the device of FIG. 10 after molding has finished and just before one side of the mold is released from the other side.
Figure 14:
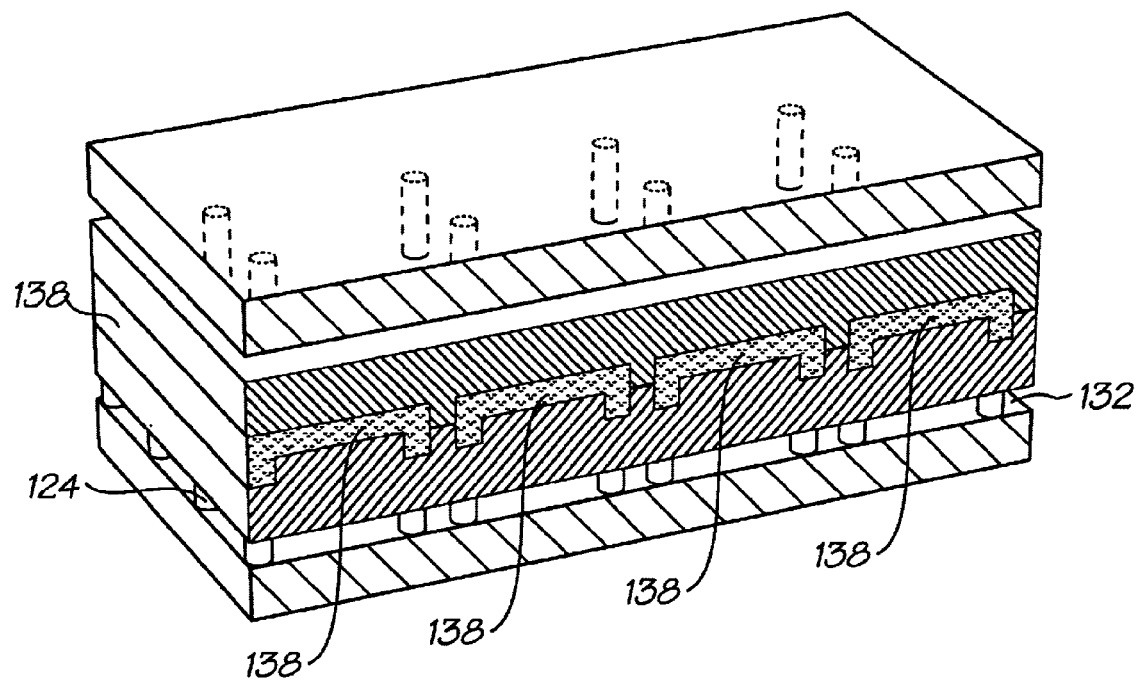
FIG. 14 shows a perspective view of the FIG. 10 device corresponding to FIG. 13.

When processed in a wafer bonding machine the sheet 134 is molded to the shape of the cavity defined by the recess 106 and the groove 112. The material is also substantially squeezed out of the gap between the two portions 114 & 116, as indicated by arrows 142 in FIG. 13a, to form a series of caps 138

As previously mentioned, the molding wafers 102 & 102 are formed using conventional lithography and deep silicon etching techniques. The accuracy of this process is dependant on the lithography and the resist used. The etch selectivity of silicon versus resist is typically between about 40:1 and about 150:1, requiring a resist thickness for a 500 $\mu$m thick etch of between about 15 $\mu$m and 4 $\mu$m respectively. Using a contact or proximity mask, critical dimensions of around 2 $\mu$m can be achieved. Using steppers, electron beam or X-ray lithography the critical dimensions can be reduced to less than a micron. Thus the material 134 may be squeezed out totally from between the portions 114 & 116, totally separating the adjacent caps 136. Alternatively a thin layer 140 up to about 2 microns thick may be left between the portions 114 & 116 between adjacent caps 136 due to the variation in position of the relative surfaces due to manufacturing tolerances.

It is not essential that the mold wafers or the release wafers be made of semiconductor materials or that they be processed using conventional lithography and deep silicon etching methods. Other materials and methods may be used if desired. However, the use of similar materials to the semiconductor wafers provides better accuracy since temperature changes have less effect. Also lithography and deep silicon etching methods are well understood and provide the degree of accuracy required. In addition, the one fabrication plant may be used for production of both the semiconductor devices and the molding apparatus.

It will be appreciated that the two mold wafers 102 & 104 will need to be shaped so that there is space for the material to move into as it is squeezed out from between the two wafers.

Figure 15:
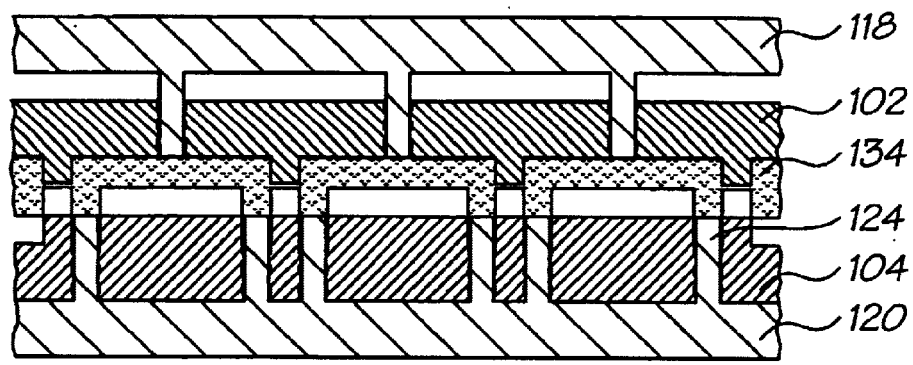
FIG. 15 shows a cross sectional side view of the device after one of the molds has been partially removed.
Figure 16:
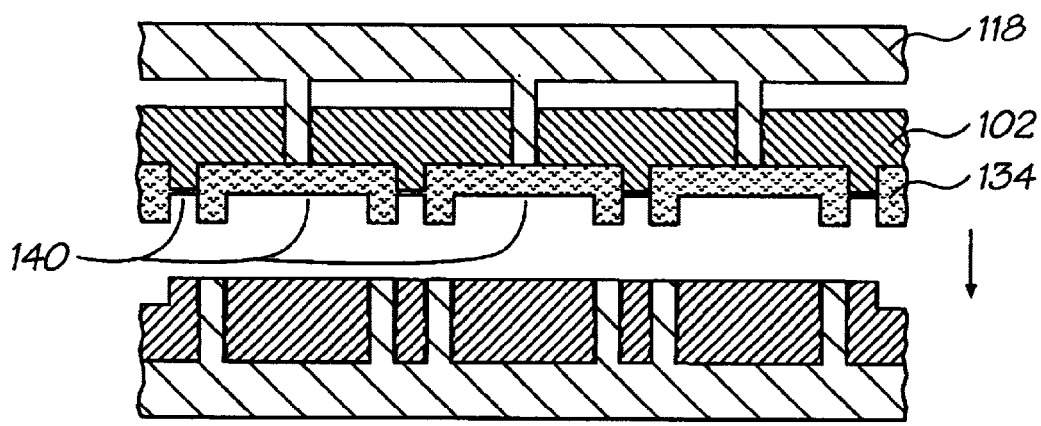
FIG. 16 shows a cross sectional side view of the device after one of the molds has been fully removed.

After forming of the protective caps 138 it is preferred to remove the lower mold and release wafers 104 & 120 whilst leaving the material 134 still attached to the upper mold wafer 102. A vacuum is applied to the gap 132 between the lower mold and release wafers. The release wafers 118 & 120 are mounted in the assembly so as to be immovable whilst the mold wafers 102 & 104 are movable perpendicular to the general plane of the wafers. Accordingly, the lower mold wafer 104 is drawn downwards to the release wafer 120. The pins 124 of the release wafer 120 firmly press against the material 134 and so retain the material 134 in position and prevent it moving downwards with the lower mold wafer 124. The configuration of the assembly 100 after this stage is shown in FIG. 15.

The lower release wafer 120 now only contacts the material 134 by pins 124 and so it is now relatively easy to remove the lower release wafer 120 from contact with the material 134 without dislodging the material from the upper mold wafer 102. This is done and the assembly is then in the configuration shown in FIG. 16, with the material 134 exposed for further processing and attachment to a wafer.

Figure 17:
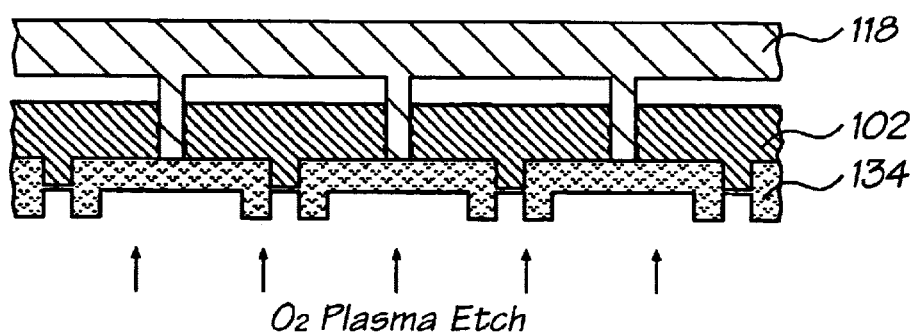
FIG. 17 shows a cross sectional side view of the device undergoing an etch.
Figure 18:
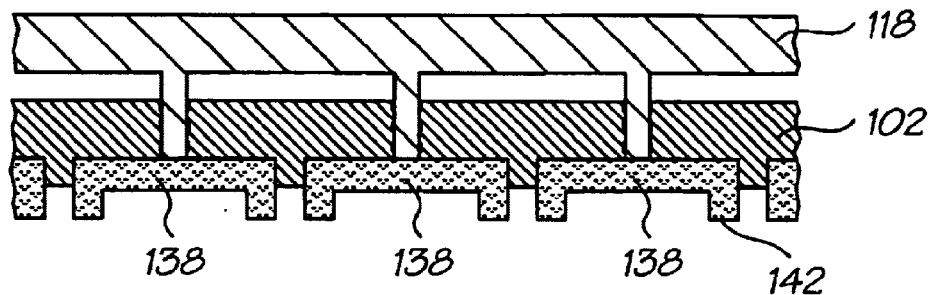
FIG. 18 shows a cross sectional side view of the device after undergoing an etch.
Figure 19:
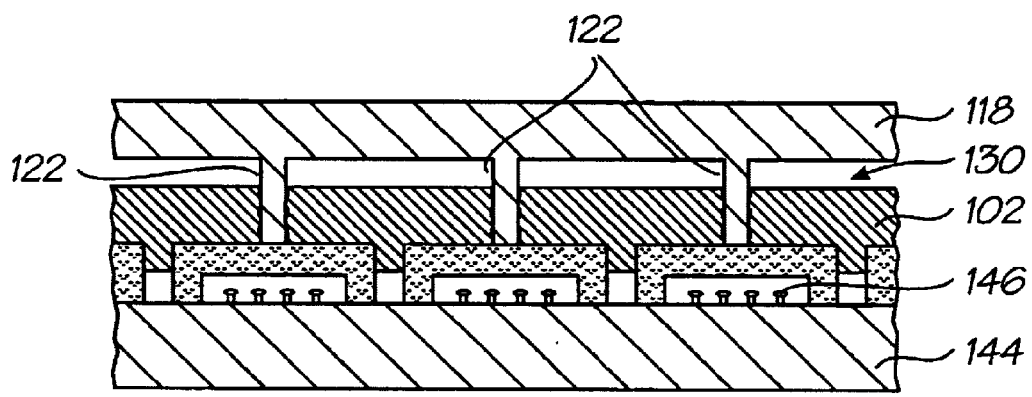
FIG. 19 shows a cross sectional side view of the device at the commencement of application to a wafer and removal of the second mold.

Whilst still attached to the upper mold, the sheet 134 is then subject to an etch, preferably an oxygen plasma etch, from below, to remove the thin layer 140 of material, as shown in FIG. 17. The etch has little effect on the rest of the material due to the significant greater in thickness of the rest of the material. The etched assembly is shown in FIG. 18.

The assembly is then placed over a wafer 144 having a number of chips formed on the wafer. Each chip has a plurality of MEMS devices 146. The components are aligned and then placed in a conventional wafer bonding machine, such as an EV 501 to bond the caps 138 to the wafer. The array of chips is positioned so that each cap overlays part or all of a chip. The devices are shown symbolically and may be MEMS devices, MOEMS devices, other micro fabricated devices, passive electronic elements or conventional semiconductor devices.

The assembly is removed from the wafer bonding machine and a vacuum is then applied to the upper gap 130 so as to draw the upper mold wafer 102 up toward the upper release wafer 118. Similar to the release of the lower mold wafer, the caps 138 are held in place by the pins 122 of the upper release wafer. Thus the chance of accidental detachment of any of the caps from the wafer due to the act of removing the upper mold wafer is reduced, if not totally prevented.

The wafer 144 is now in a state where each chip is protected by a discrete cap 138. The wafer can then be singulated into individual die. If the chips are arranged in a regular array, the conventional methods of wafer singulation—sawing or scribing may be used. However, if the separation lines between chips are not regular or if the chips are too fragile for sawing or scribing, deep reactive ion etching (DRIE) may be used to singulate the wafers. Although DRIE is much more expensive than wafer sawing, this is moot if the wafer already required through wafer deep etching, as is the case with an increasing number of MEMS devices. If etching is used, the wafer 144 is next subject to a deep silicon etch in an etching system, such as an Alcatel 601 E or a Surface Technology Systems Advanced Silicon Etch machine, to separate the wafer 144 into individual packages. This etch is carried out at a rate of about 2 to 5 microns per minute and may be applied from either the cap side of the wafer or the bottom side of the wafer. The etch is highly anisotropic (directional) so there is relatively little etching of silicon sideways of the direction of the etch. If the etch is applied from the caps side, the caps 138 act as masks and only the silicon material between the caps is etched. The etching continues until all the silicon material between individual chips is removed, thereby separating the chips 148 for subsequent processing. If the etch is applied from below, a separate mask will need to be applied to the bottom surface of the wafer.

Any silicon exposed to the direction of the deep etch at the separation stage will be etched away. Thus if the etch is from the top (cap) side any exposed silicon which needs to be retained, such as electrical bond pads, on the upper surface of the chip should be protected, such as by a resist, which must be removed prior to wire bonding. An alternative is to apply a mask to the lower surface of the wafer and to deep silicon etch from the rear. Alternatively second caps may be provided for the lower surface of the wafer, utilizing the same manufacturing methods as for the upper caps and using the lower caps as masks for the etch. By providing both upper and lower caps at the wafer stage, each chip is substantially completely packaged prior to singulation.

Figure 22:
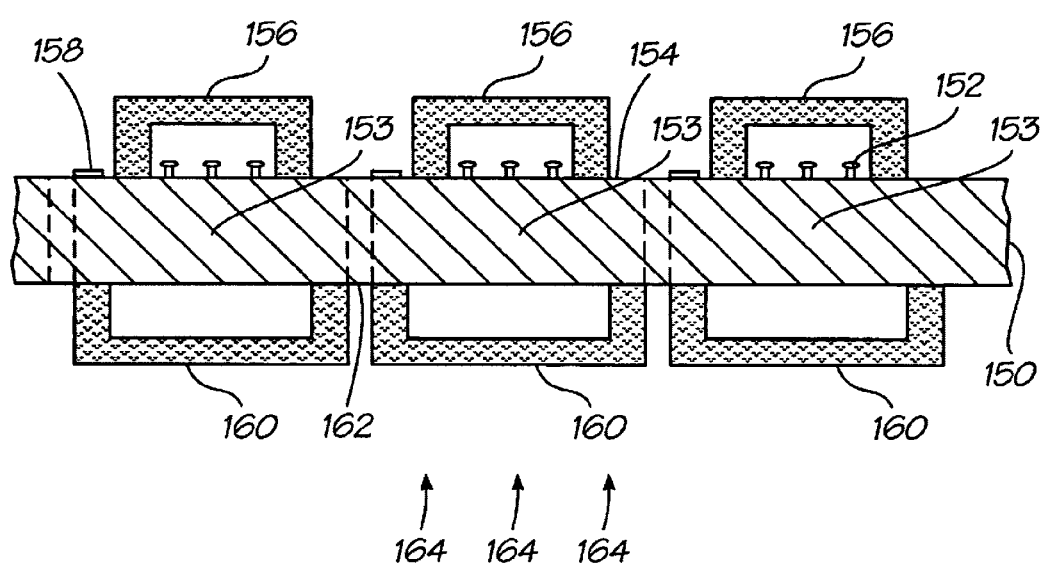
FIG. 22 shows a cross sectional side view of a wafer with caps applied to both sides, before singulation of the wafer.

FIG. 22 shows a technique for providing protective caps for both the upper and lower surfaces. The figure shows a wafer 150 upon which have been formed a series of MEMS device chips 153 on an upper surface 154. Each chip 153 includes one or more MEMS devices 152 and optionally other micro fabricated elements. A first set of protective caps 156 have been formed on the upper surface 154 as per the techniques of the invention previously described. The bond pads 158 of the individual chips 153 are on the upper surface 154 and are not covered by the protective caps 156. A second set of protective caps 160 have been formed on the lower surface 162 of the wafer as per the techniques of the invention previously described. The first and second sets of protective caps may be applied to the wafer sequentially or may be applied to the wafer simultaneously. The order of application is not important. The second set of caps 160 are located under each chip 153 but are larger than the first set 156 and extend under and beyond the bond pads 158.

The wafer 150 is then subject to a deep silicon etch from the lower surface of the wafer as indicated by arrows 164, rather than from the upper surface, to separate the individual chips. The lower caps 160 thus act as a mask to the bond pads 158 and because the etching process is very directional, only silicon between the lower caps 160 of the individual chips is etched away. The bond pads 158 and other exposed parts on the upper surface within the outline of the lower caps are substantially unaffected by the etch and so the chips 152 will not be damaged by the etch.

It will be appreciated that the provision of the second set of caps is only a necessity where a hollow space is required; if a second set of caps is unnecessary or undesirable, a resist may be coated onto the lower surface with a grid pattern to leave areas between the chips exposed for deep etching.

Figure 28:
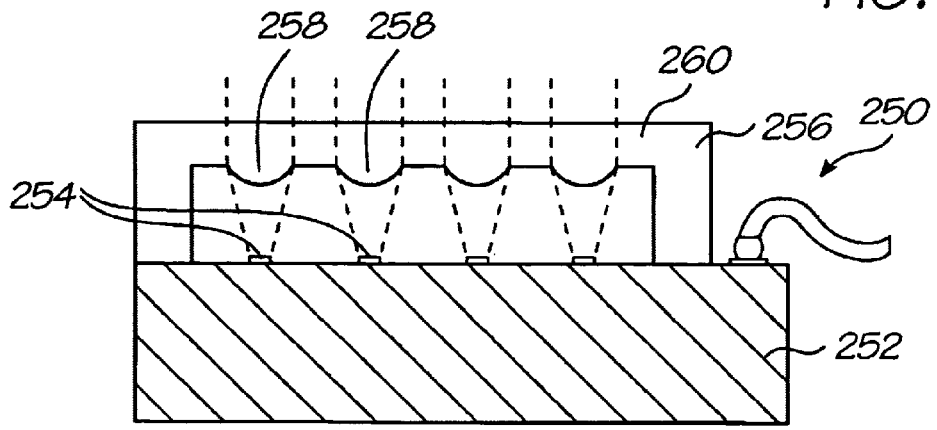
FIG. 28 shows a cross sectional view of an optical semiconductor chip in its finished packaged form.

FIG. 28 shows a semiconductor laser chip package 250 incorporating a cap according to the invention. The package includes a semiconductor chip 252 on which have been formed a series of semiconductor laser devices 254. For example these may be Vertical Cavity Surface Emitting Lasers (VCSELs). The VCSELs emit laser light generally perpendicular to the plane of the chip. The cap 256 has been formed and attached to the chip using the inventive techniques described herein. However, the cap is formed of a material substantially transparent to the wavelength(s) of the light emitted by the VCSELs. In addition the cap has been formed so as to have a series of refractive lenses 258 in the cover portion 260. This is relatively easy to accomplish by fabricating the mould wafers with appropriately shaped recesses.

The steps involved in manufacture of the cap is shown in FIGS. 23 to 26. The cap is manufactured using the molding techniques previously described, but modified as below.

The lower mold wafer 200 used to form the cap needs to have a series of lens forming depressions formed in its molding surface. A resist mask 201 is applied to the upper surface having a series of small holes 203 in the mask 201 (see FIG. 23a). The wafer is then subject to an isotropic etch. The size of the holes is relatively small and so the etching agent etches a hemispherical recess 202 behind each hole (see FIG. 23b). After etching the mask 201 is removed.

Figure 23A:
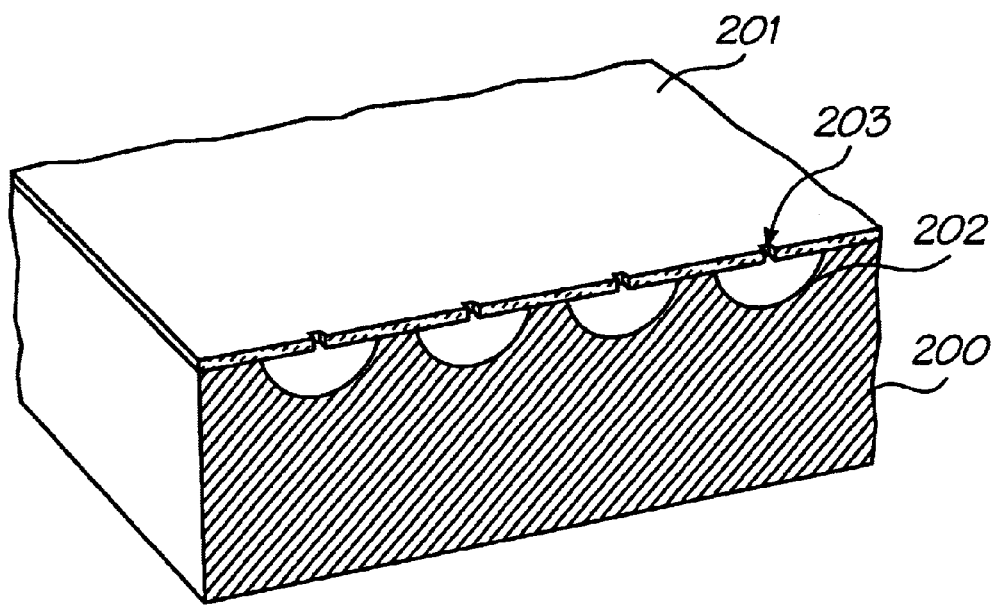
FIG. 23 shows a cross sectional side view of a stage of manufacture of a molding wafer.
Figure 23B:
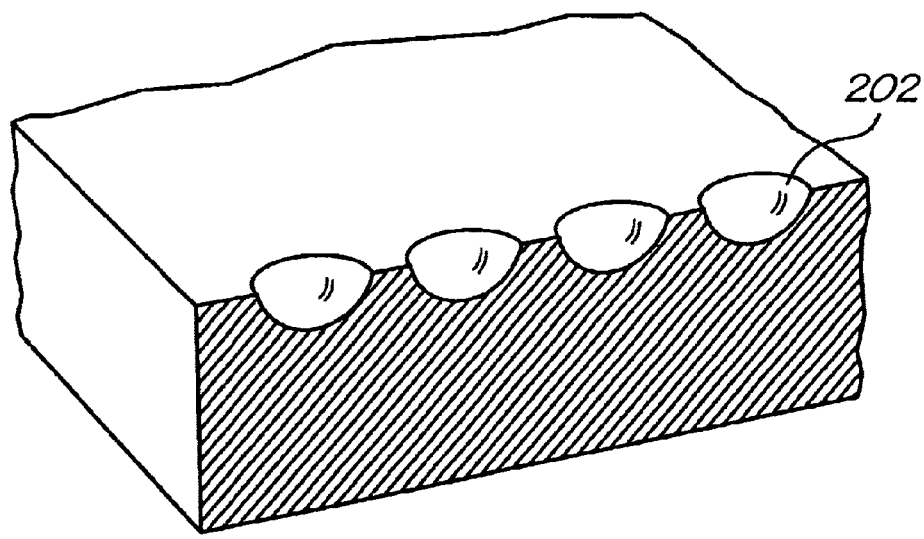
Figure 23C:
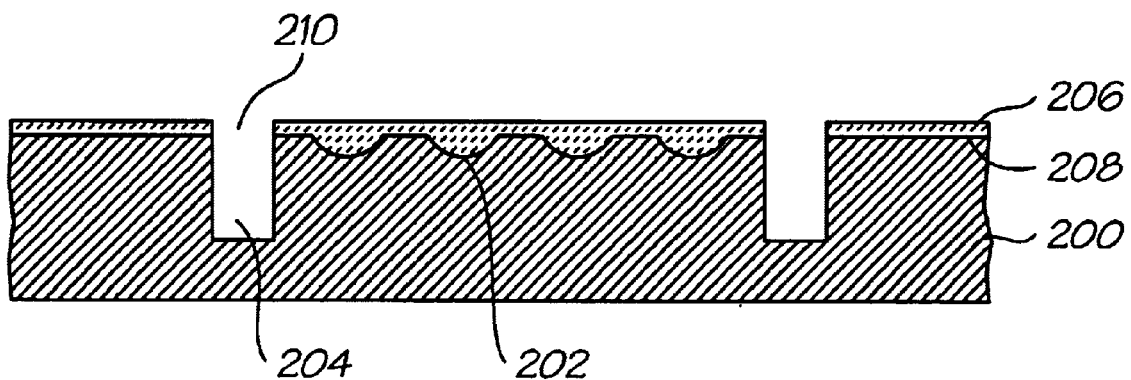
Figure 24:
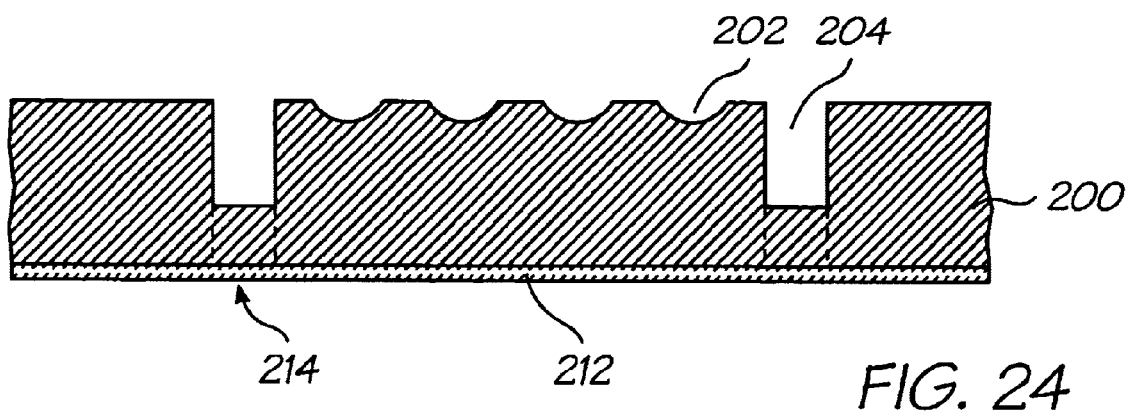
FIG. 24 shows a cross sectional side view of the wafer of FIG. 23 at a next stage of manufacture
Figure 25:
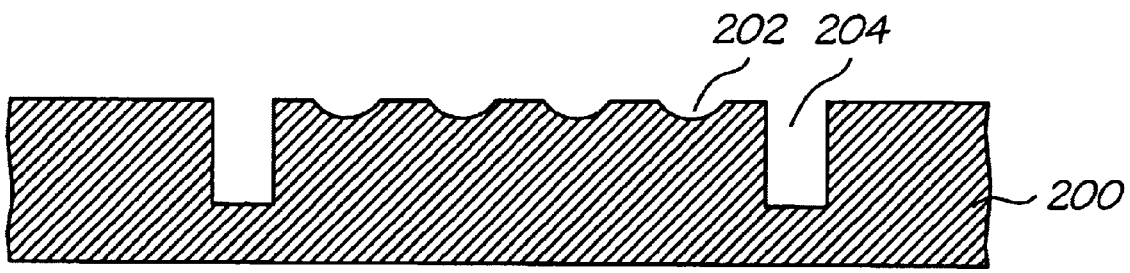
FIG. 25 shows a cross sectional side view of the finished wafer of figure.

Referring to FIG. 23c, the recesses 204 for the side walls of the cap are then formed by applying a second resist 206 to the upper surface 208 having apertures 210 corresponding to the wall forming recesses. An anisotropic deep silicon etch is applied to the upper surface to form the wall forming recesses 204, as seen in FIG. 23. Referring to FIG. 24, a second resist 212 is applied to the lower surface with openings for forming ejector pin holes 214. An anisotropic deep silicon etch is applied to the lower surface to form the ejector pin holes, as seen in FIG. 24. FIG. 25 shows a side view of the finished lower wafer.

Figure 26:
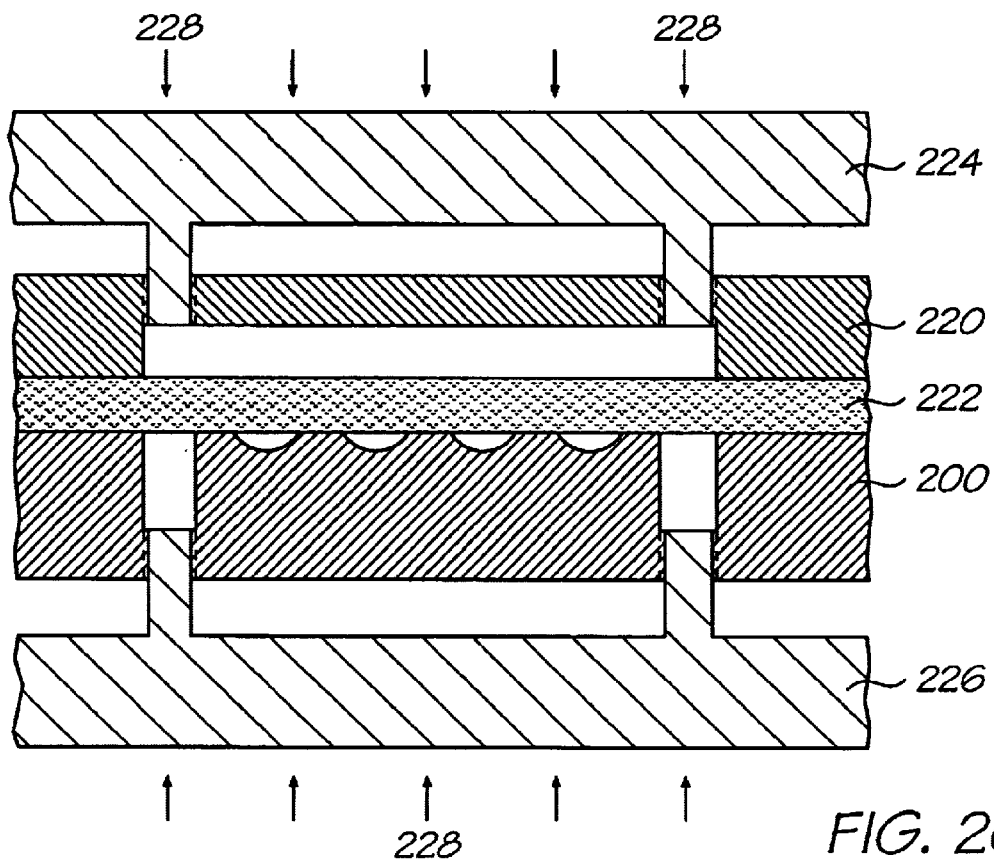
FIG. 26 shows a cross sectional view of a molding process using the wafer of FIG. 25.
Figure 27:
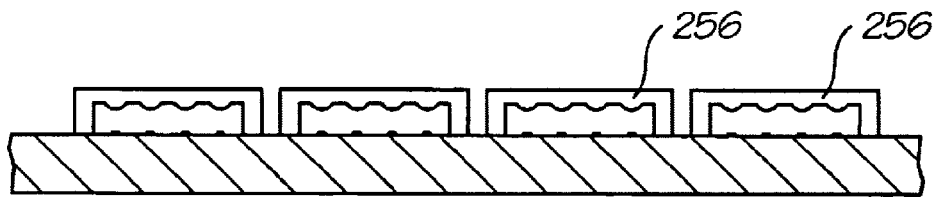
FIG. 27 shows a cross sectional view of a semiconductor wafer having optical devices with packaging caps formed by the process of FIG. 26 attached prior to separation of the wafer into separate packages.

A plastic sheet 222 is then molded using the molding technique previously described, shown in FIG. 26. The upper cap 220 and upper and lower release wafers 224 & 226 respectively are as previously described. As with the standard technique, infrared radiation is used to heat the plastic sheet as pressure is applied, as indicated by arrows 228. The molding forms caps 256 with a series of elongate lenses on the lower surface of the caps. The caps are then bonded to a wafer as shown in figure using the methods previously described. The wafer is singulated and necessary electrical connections made to produce the finished package shown in FIG. 28.

Throughout the specification, reference is made to semiconductors and more particularly silicon semiconductors. It is to be understood that the invention is not limited to use on semiconductors or silicon based semiconductors and has application to non semiconductor devices and to non silicon based semiconductors, such as those based on gallium arsenide semiconductors.

Whilst the invention has been described with particular reference to MEMS devices, it is to be understood that the invention is not limited to MEMS or MOEMS devices and has application to any devices which are or may be bulk fabricated on a wafer.

It will be apparent to those skilled in the art that many obvious modifications and variations may be made to the embodiments described herein without departing from the spirit or scope of the invention.

I claim:

1. A method of manufacturing a light emitting semiconductor package, the method comprising the steps of:
    (A) obtaining a semiconductor wafer which includes a plurality of light emitting devices residing on or in a surface of the semiconductor wafer;
    (B) forming at least one first hollow cap, each first hollow cap formed to provide:
        (1) a central portion and first perimeter walls extending from the perimeter edge of the central portion with the free edges of the first perimeter walls adapted to be bonded to the surface of the semiconductor wafer to provide a first cavity;
        (2) at least one region of the central portion which is substantially transparent or translucent to electromagnetic radiation;
    (C) bonding the at least one first hollow cap to the semiconductor wafer, the central portion overlying at least one of the plurality of light emitting devices; and,
    (D) separating the semiconductor wafer with bonded caps into light emitting semiconductor packages.

2. The method as claimed in claim 1, wherein the first hollow cap is formed by molding a sheet.

3. The method as claimed in claim 2, wherein infrared radiation is used to heat the sheet to facilitate molding.

4. The method as claimed in claim 2, wherein the sheet is a plastic sheet.

5. The method as claimed in claim 1, wherein one or more elongate lenses are formed on the lower surface of the central portion of the first hollow cap.

6. The method as claimed in claim 5, wherein the one or more elongate lenses are formed by a mold wafer disposed with one or more depressions in the surface of the mold wafer.

7. The method as claimed in claim 1, wherein more than one second hollow cap is bonded to the semiconductor wafer on the surface opposite the bonded first hollow cap.

8. The method as claimed in claim 7, wherein the wafer is separated by etching the wafer between the second hollow caps.

9. The method as claimed in claim 1, wherein the at least one region refracts the electromagnetic radiation emitted by the at least one device.

10. The method as claimed in claim 1, wherein the cap is further formed to include at least one attachment means for attaching an electromagnetic radiation transmitting cable or fiber to the cap, whereby at least some electromagnetic radiation emitted from the at least one device passes through said at least one region into the cable or fiber.

11. The method as claimed in claim 1, wherein more than one region of the central portion is formed, each region of the central portion associated with at least one light emitting device.

* * * * *